US005215470A

United States Patent [19]

Henry et al.

[11] Patent Number: 5,215,470

[45] Date of Patent: Jun. 1, 1993

[54] CONNECTOR ASSEMBLY AND METHOD OF MANUFACTURE

[75] Inventors: Randall R. Henry; Michael R. Sneed, both of Harrisburg, Pa.

[73] Assignee: AMP Incorporated, Harrisburg, Pa.

[21] Appl. No.: 906,065

[22] Filed: Jun. 26, 1992

[51] Int. Cl.$^5$ .............................................. H05K 1/00

[52] U.S. Cl. ...................................... 439/63; 439/581

[58] Field of Search ............................... 439/578-585, 439/675, 322, 901-906, 607, 610, 92, 63

[56] References Cited

U.S. PATENT DOCUMENTS

| | | | |
|---|---|---|---|
| 4,453,796 | 6/1984 | Monroe | 439/581 |
| 4,666,231 | 5/1987 | Sheesley et al. | 439/581 |
| 4,718,854 | 1/1988 | Capp et al. | 439/581 |
| 4,741,703 | 5/1988 | Johnescu et al. | 439/581 |
| 4,795,352 | 1/1989 | Capp et al. | 439/63 |
| 4,884,982 | 12/1989 | Fleming et al. | 439/620 |
| 4,904,206 | 2/1990 | Laudig et al. | 439/578 |
| 4,964,805 | 10/1990 | Gabany | 439/63 |
| 5,073,123 | 12/1991 | Birch et al. | 439/188 |
| 5,088,937 | 2/1992 | Gabany | 439/581 |
| 5,100,344 | 3/1992 | Truong | 439/578 |

*Primary Examiner*—David L. Pirlot
*Attorney, Agent, or Firm*—Gerald K. Kita; William B. Noll

[57] ABSTRACT

An electrical connector, such as a miniature UHF connector, and a method of manufacturing features the provision of a relatively heavy metallic shell (12) containing a dielectric insert (30) holding a signal contact (44) coaxially therewithin and having an opening (22) with a separate insert (52) and grounding element (60) fitted in the said opening to enclose the interior of said shell, the said grounding element including a plurality of fine posts (64) adapted to fit in holes in a circuit board to ground the said connector with the said shell elements fitted together in a ready assembly to provide an enclosure shielding the signal path through the said connector from radiation external to the said shell and shielding the exterior of the said shell from radiation from within the said shell, the method including forming and processing the shell and said grounding element separately with variations in the positioning and size and shape of the said posts to fit the fingerprint of a variety of assemblies.

4 Claims, 2 Drawing Sheets

CONNECTOR ASSEMBLY AND METHOD OF MANUFACTURE

This invention relates to an electrical connector assembly and method of manufacture, particularly for a miniature UHF coaxial connector.

BACKGROUND OF THE INVENTION

In U.S. Pat. No. 5,088,937 granted Feb. 18, 1992, there is disclosed a right-angle coaxial jack connector having an outer metallic shielding and grounding shell containing a coaxial transmission path for ultra high frequency signals with the shell including parts that fit together to seal the connector against contamination and radiation. The shell and cooperating metal parts minimize radiation from signal energy carried by the connector and interference with signals carried by the connector by radiation external to the connector as well as providing a grounding function for circuits connected by the connector. The various parts that form the shell include elements that prevent internal contamination by flux, solder products and the like, when the connector is soldered to a printed circuit board as part of an assembly for electronic apparatus. The patented jack connector includes relatively fine posts extending from the rear bottom thereof that are fitted into holes in a printed circuit board to be soldered thereto to effect the grounding connection of the shell that serves as a shield. The shell and associated parts are typically formed by die casting zinc or zinc alloys which elements are then trimmed to prepare the exterior surfaces for the necessary plating to control oxidation of the connector. Typically, the parts are washed, scrubbed, mechanically or chemically, and then plated with various platings including tin, nickel, gold, or, in certain occasions, silver, these various platings being combined to prevent migration of the zinc constituents through to the surface of the outside plating. Most typically, the parts are barrel plating requiring a tumbling in the plating operation with considerable mechanical stress to the parts. It has been discovered that the most frequent loss of elements is during the tumbling operation and/or handling or subsequent assembly of the parts, particularly the small posts that are made integral with the shell.

Accordingly, it is an object of the present invention to provide a connector construction that facilitates manufacture, including plating and assembly, with minimum damage to the fine posts utilized to solder a connector shell to a printed circuit board or the like. It is a further object to provide an improved construction and method relative to the prior art in making electrical connectors.

It is a still further object to provide an improved UHF-type connector assembly and method of manufacture.

SUMMARY OF THE INVENTION

The present invention achieves the foregoing objectives by providing a connector having a relatively heavy grounding shield shell formed as by die casting of zinc or zinc alloys to include in the rear an opening facing rearwardly and downwardly from the bottom of the shell. An insert is formed to close the rear of the opening of a separate element and a relatively lightweight base element, typically formed as by die casting, is provided to close the bottom portion of the opening by an engagement with the shell. In a preferred embodiment, the shell opening is made to have internally facing grooves that receive the outside edges of the insert element in a sliding engagement to position the insert in the opening with the posts for the connector formed on the insert extending downwardly from the shell bottom. Next, the dielectric insert and signal contact is installed. The back insert is positioned in place last with the bottom insert base in position to lock the back insert in position with shell edges coined to keep the back insert in place. The invention contemplates a reversal of the receiving grooves and projections so that the insert base includes grooves and the shell includes projections. The invention also contemplates that the connector may have insert bases with posts of different sizes or posts on different centers to accommodate different footprints on printed circuit boards to thus allow a more efficient manufacturing operation for a family of connectors. The small fine posts, being formed on a relatively light piece, can be separately treated in a manufacturing process including barrel plating with a minimum loss by fracture or breakage of the posts, compared to prior art practices wherein the relatively large heavy assembly contained the integral posts.

IN THE DRAWINGS

DETAILED DESCRIPTION OF THE INVENTION

Figure 1:
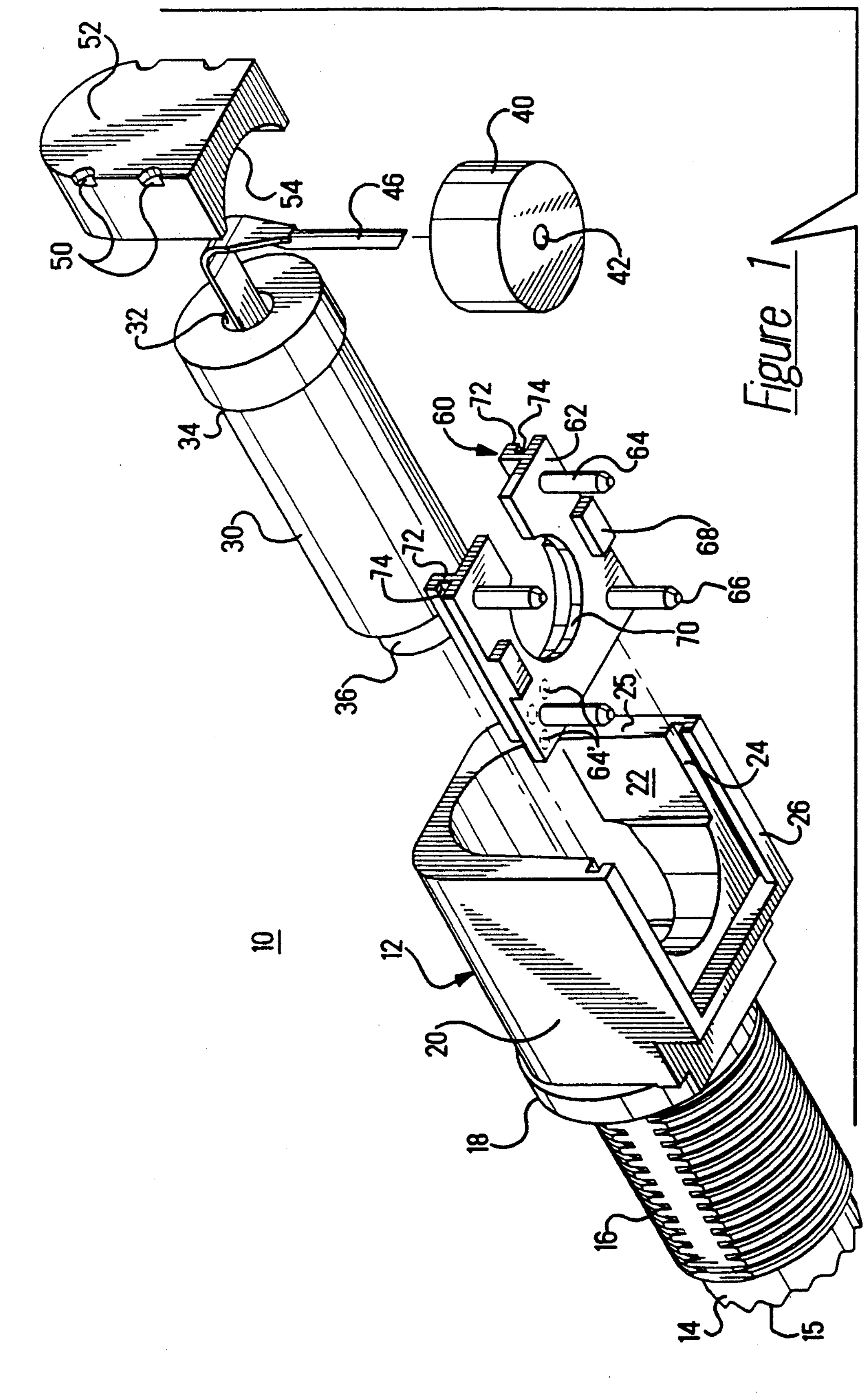
FIG. 1 is a perspective, showing element in an exploded arrangement prior to assembly viewed from the rear and underside of the connector assembly.
Figure 2:
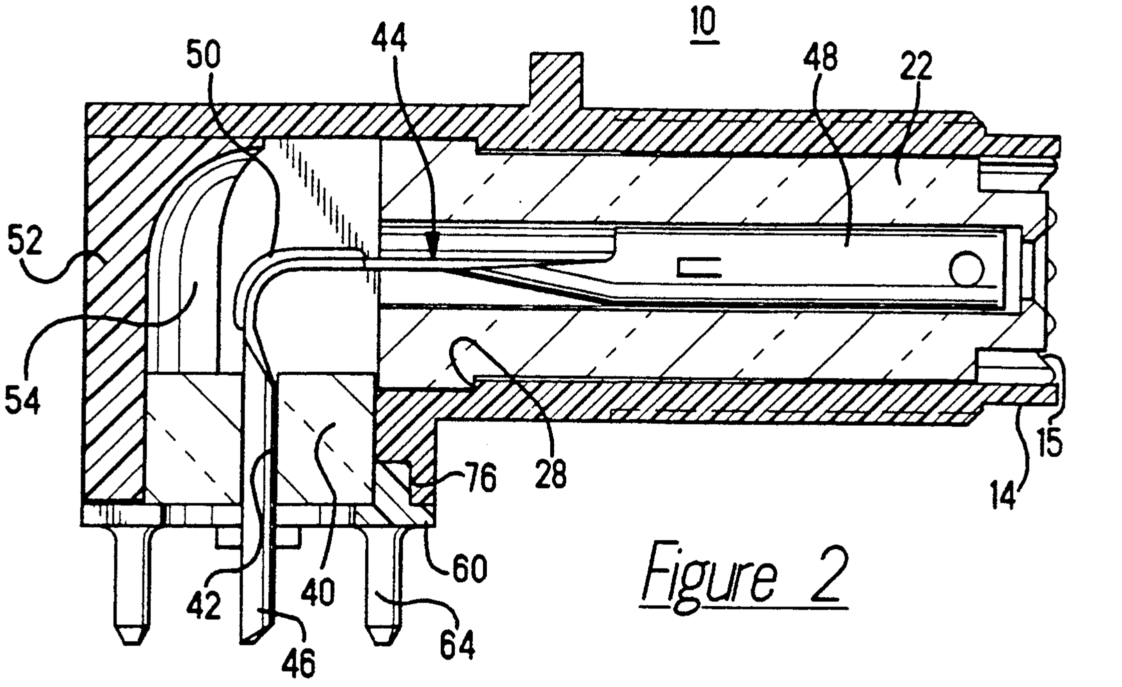
FIG. 2 is a side, elevational, and partially sectioned view of the elements of FIG. 1 fully assembled.
Figure 3:
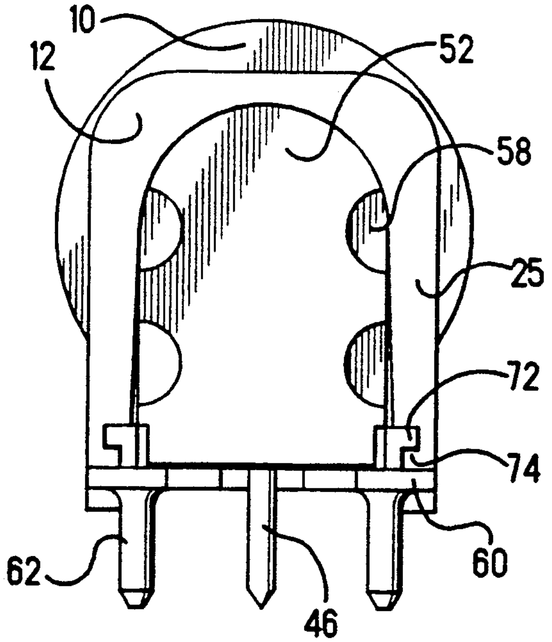
FIG. 3 is a rear, elevational view of the assembly of elements of FIG. 2.

Reference is made to the aforementioned U.S. Pat. No. 5,088,937 for a description of one type of connector served by the present invention through a modification of the assembly and an improved method of manufacture therefor. Referring to FIG. 1 of this Application, an electrical connector assembly 10 is shown to include a grounding and shielding shell 12 having a forward sleeve portion 14 with teeth as at 15 intended to mate with a mating connector that engages assembly 10. The forward end of the connector includes threads as at 16 that mate with the interior threads of the mating connector and a flange 18 that serves to provide a stop for such engagement. Shell 12 includes a rear portion 20 that has an interior cavity 22 that opens from the rear defined by walls 25 and to the bottom defined by walls 26 to extend through the shell. As can be discerned from FIG. 1, the walls 26 each include interior grooves 24 having a function to be described hereinafter. The side profile in section of the shell 12 can be seen in FIG. 2 to include an interior offset 28 that serves as a stop positioning a dielectric insert within the cavity 22 that can be seen to extend from the rear through shell 12. The dielectric insert 30 includes an interior bore 32 that extends therethrough, an enlarged outer diameter portion 34 that engages offset 28 to position the insert within shell 12, and a reduced diameter portion 36 in the forward end thereof. A further dielectric insert 40 is provided that fits up within the bottom aperture of shell 12 in an insert 60 for purposes to be described. Note in FIG. 1 and in FIG. 2 that insert 40 includes a central aperture 42 that receives a portion of the signal contact. The contact shown as 44 includes a downwardly extending leg or post 46 and, as shown in FIG. 2, a forward portion 48 that is a receptacle contact adapted to receive the signal pin contact of a mated connector fitted therewithin. As can be seen also in FIG. 2, the contact 44 includes a bent portion 50 more or less coaxial to the interior space within cavity 22. FIGS. 1, 2, and 3 show a further insert 52 rounded interiorly as at 54 in FIG. 1 and of a configuration to fit within the complementary interior of shell 12 defined by a rear flat face 25 of such shell. The rounding 54 serves with other portions of the shell to define an essentially coaxial path. Energy propagated through the connector following the signal contact 44 is transmitted in part through the dielectric including insert 30, the air space surrounding the ends of 30, and the dielectric 40.

As can be seen in FIG. 3, the insert 52 includes edge reliefs 58 that may be utilized to lock the insert 52 axially to the shell 12 by a slight deformation of the edge of the material of 25, a deformation just sufficient to effect the lock without fracturing the plating of the shell. Alternatively, solder or other means may be utilized to lock insert 52 to shell 12. The insert shown as 60 in FIGS. 1-3 is comparatively small and light relative to the shell 20. Insert 60 includes a lower, or bottom face 62 having a number of relatively fine posts 64 extending therefrom, rounded as at 66 to facilitate an insertion of the posts within the holes of a printed circuit board and adapted to be soldered to such holes and traces contained within such holes to electrically and mechanically lock the connector shell to the printed circuit board and serve, in certain instances, as a partial mounting for the connector. As is shown in FIG. 1 through the phantom circles 64', it is contemplated that the posts 64 may have other positions, three exemplary positions for one post being shown. The invention contemplates different size posts being used than that shown with some of the posts of the larger diameter or greater or shorter length than other posts to fit the particular packaging concept being employed. Insert 60 includes projections 68 extending from surface 62 that serve as standoffs, holding the face of 62 slightly above the printed circuit board to allow a cleansing following soldering of any material that might be trapped under the face surface of 62. Insert 60 includes at the outside edges projections 72 grooved as at 74 of a dimension and geometry to fit within the grooves 24 adjacent a lower surface 26 of shell 12. This engagement is shown in FIGS. 2 and 3.

In accordance with the invention, different inserts 60, having differently centered posts or different sizes of posts, may be manufactured for use with the same shell 12 and other assembly elements to thus complete a family of connectors adaptable to fit different footprints on printed circuit boards of electronic assemblies. Insert 60 includes a central aperture 70 slotted at the trailing edge of the insert. As can be seen in FIGS. 2 and 3, the connector is assembled by pre-installing a contact 44 in inserts 30 and 40 and fitting inserts within shell 12 following installation of insert 60 in the bottom with insert 50 then positioned by sliding the insert in the rear of shell 12. Thereafter, insert 52 is locked in place as shown in FIGS. 2 and 3 and secured to the shell to lock the assembly together.

The invention fully contemplates a reversal of projections and grooves with respect to insert 60 and shell 12 or other means of attaching the insert to the shell. When the assembly 10 is completed, the signal path represented by contact 44 and the surrounding plastic and dielectric material is essentially sealed from radiating outwardly, assuming a mating connector is engaged with the front end of the shell and that that connector is mounted on a printed circuit board. Thus, signals representing unwanted radiation exterior to shell 12 cannot by induction alter the signal being carried by the connector, and signals propagated by the connector cannot be radiated externally to cause problems with related circuits or equipment. Also note that the connector, when assembled as in FIGS. 2 and 3, is essentially sealed so that contaminants cannot migrate or find their way into the interior volume of the connector to cause an alteration in impedance, shorting, or the like. The connector is shown assembly 10 can be so manufactured, assembled and shipped and utilized as an integral assembly.

In accordance with the invention in a preferred embodiment, the shell 12, insert 52, and insert 60 are manufactured by die casting of zinc or zinc alloys with a subsequent slight trimming of flash as by tumbling or by hand, washing or a treatment for plating with the insert 60 separately plated as by barrel plating without risk of the relatively heavy loads of shell 12 causing post breakage.

The invention thus provides a connector assembly useful for handling ultra-high frequencies, frequencies on the order of 1 or 2 Ghz, and a method of manufacturing that facilitates handling and processing of elements that are relatively small and fine and fragile, compared to the shell portions of the connector.

Having now described the invention relative to drawings thereof, claims are appended intended to define what is inventive.

In the claims:

1. An electrical connector assembly adapted to transmit high frequency signals on the order of 1 to 2 Ghz to circuits of an assembly including a printed circuit board upon which the connector is mounted, a shield and grounding structure comprised of a metallic shell having a central bore and a rearwardly disposed opening, metallic element members fitting into said opening to seal the central bore such that upon the connector assembly being mounted on the printed circuit board and mated with a mating connector, the interior thereof is shielded against radiation external to the shell, and the exterior of the shell is shielded against radiation emanating from the interior of the shell, a signal contact and dielectric insert fitted in said shell, where at least one of the metallic element members is a relatively light, zinc die casting, and carrying a plurality of relatively fine terminal posts adapted to fit into holes in the printed circuit board and be connected to conductive traces thereon to ground said connector, mounting means adapted to electrically and mechanically attach one of said metallic element members to said shell to connect said shell to ground and mount said connector on said printed circuit board.

2. The assembly of claim 1 wherein said mounting means includes grooves positioned internally of the said shell proximate the said opening and said mounting means include edge portions that fit in sliding engagement with the said grooves.

3. The assembly of claim 1, wherein the said shell and said metallic element member are separately coated with oxidation-reducing coatings prior to assembly.

4. The assembly of claim 1 wherein the said shell and said metallic element members have surface treatments preparatory to plating and assembly as separate entities.

* * * * *